United States Patent
Yu

Patent Number: 5,982,199
Date of Patent: Nov. 9, 1999

[54] FASTER NAND FOR MICROPROCESSORS UTILIZING UNEVENLY SUB-NOMINAL P-CHANNEL AND N-CHANNEL CMOS TRANSISTORS WITH REDUCED OVERLAP CAPACITANCE

[75] Inventor: Larry S. Yu, San Jose, Calif.

[73] Assignee: Advanced Micro Devices, Inc., Sunnyvale, Calif.

[21] Appl. No.: 09/006,209

[22] Filed: Jan. 13, 1998

[51] Int. Cl.[6] .......................... H03K 19/094; H03K 19/20
[52] U.S. Cl. ............................................. 326/121; 326/103
[58] Field of Search ..................................... 326/121, 101, 326/102, 103, 112, 119, 17; 257/204, 206

[56] References Cited

U.S. PATENT DOCUMENTS

| | | | |
|---|---|---|---|
| 5,038,192 | 8/1991 | Bonneau et al. | 257/206 |
| 5,083,178 | 1/1992 | Otsu | 257/208 |
| 5,140,594 | 8/1992 | Haulin | 326/11 |
| 5,420,447 | 5/1995 | Waggoner | 257/206 |

FOREIGN PATENT DOCUMENTS

| | | | |
|---|---|---|---|
| 359112724 | 6/1984 | Japan | 326/121 |
| 002275143 | 8/1994 | United Kingdom | 326/121 |

*Primary Examiner*—Michael Tokar
*Assistant Examiner*—Daniel D. Chang
*Attorney, Agent, or Firm*—Davis Chin

[57] ABSTRACT

There is provided an improved NAND logic gate circuit for use in microprocessors and a method for fabricating the same so as to be capable of operating at higher speeds. The NAND logic gate circuit includes a parallel structure formed of a plurality of P-channel MOS together in parallel and a stacked structure formed of a plurality of N-channel MOS transistors all connected together in series. Each of the plurality of P-channel MOS transistors has a first sub-nominal channel length and reduced overlap capacitance. Each of the plurality of N-channel MOS transistors has a second sub-nominal channel length and reduced overlap capacitance.

12 Claims, 2 Drawing Sheets

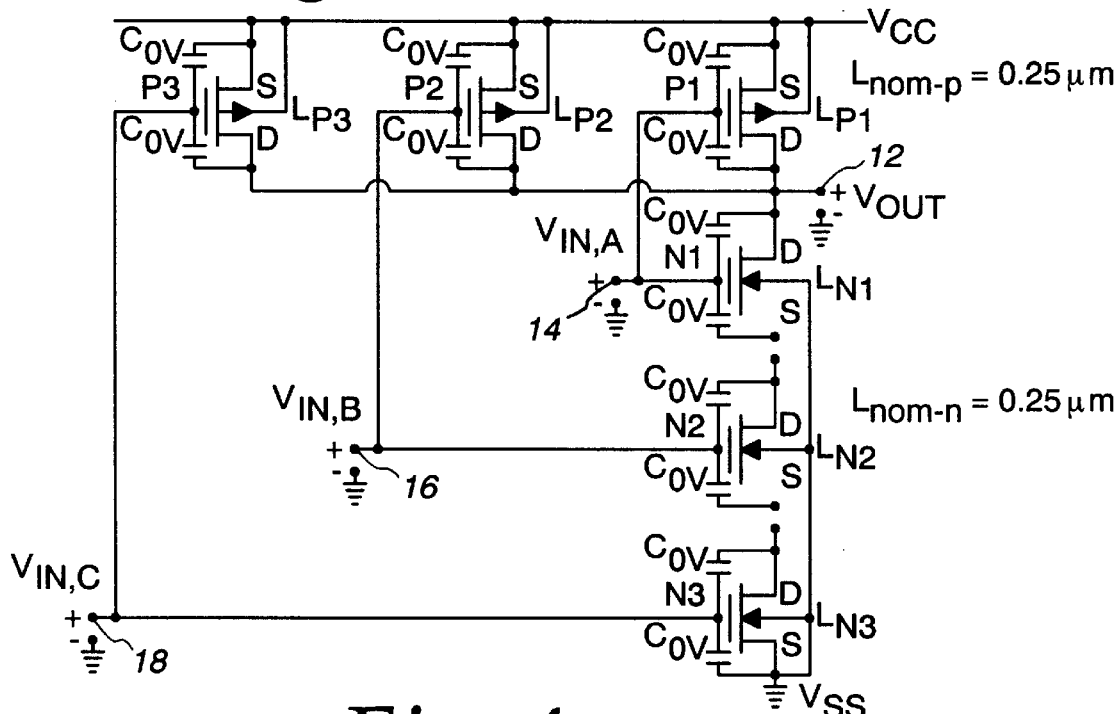
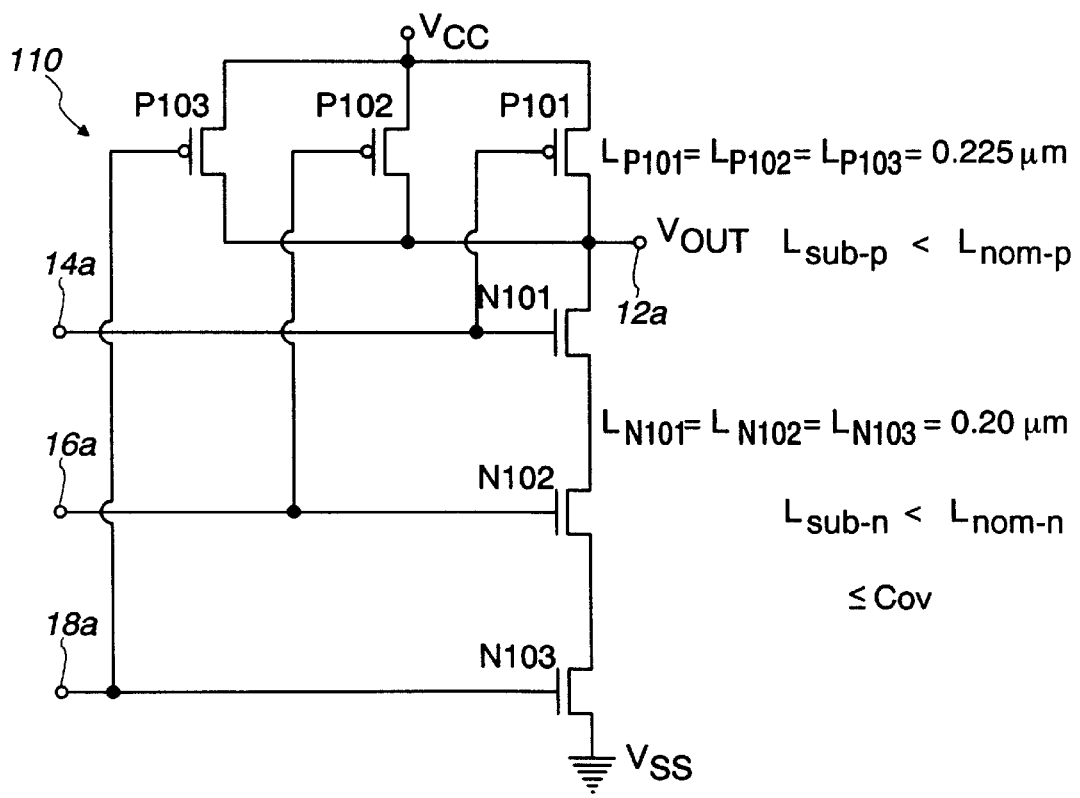

5,982,199

FASTER NAND FOR MICROPROCESSORS UTILIZING UNEVENLY SUB-NOMINAL P-CHANNEL AND N-CHANNEL CMOS TRANSISTORS WITH REDUCED OVERLAP CAPACITANCE

BACKGROUND OF THE INVENTION

1. Field of the Invention

This invention relates generally to a semiconductor integrated circuit device and a method for fabricating the same. More particularly, the present invention relates to an improved NAND logic gate circuit for use in microprocessors and a method of fabricating the NAND circuit so as to be capable of operating at higher speeds.

2. Description of the Prior Art

It is generally known that the design and fabrication of microprocessors have become a very competitive business. At present, it is also well-known that increasing the speed by 10% in the microprocessor design will typically provide a 40% increase in profitability. As a consequence, there exists a continuing challenge to microprocessor designers to increase the speed of microprocessors but yet maintaining a relatively low leakage current in order to operate at a low power consumption.

Heretofore, there have been encountered various prior art techniques which are commonly used to increase the speed of microprocessors and are listed as follows:

(1) Increasing of the DC power supply potential.

(2) Reducing the effective channel length of CMOS devices.

(3) Reducing or lowering the threshold voltage of the CMOS devices.

Thus far, it appears that the most effective way of boosting the speed performance in the microprocessor design is through the channel length reduction. However, there are certain limitations and design penalties in the process of continually reducing of the channel length. For example, there will be decreased the amount of current driving capability when the sizes of the devices are scaled-down. In addition, a larger amount of leakage current will occur, due to the reduction of channel length, which may create serious problems in chip design and application.

The inventor has realized that there exists another technique, besides the channel length reduction, in which to substantially improve the CMOS transistor speed. This new technique is achieved by the reduction of overlap capacitance, which thus far has not been considered by anyone to the knowledge of the inventor. As a background and in order to assist in the understanding of the present invention, there is shown in FIG. 1 a cross-sectional view of a MOS transistor 102 which includes a source region 104 and a drain region 106 formed on a surface of a silicon substrate 108. A gate oxide film 110 is formed on the substrate between the source and drain regions. A gate electrode 112 is formed on the surface of the gate oxide film 110. As can be seen, the overlap capacitance $C_{OV}$ on the source side is defined to be equal to the overlapping capacitance $C_{OV1}$ between the gate and the source plus the fringing capacitance $C_{OV2}$ between the edge of the gate and the source. Similarly, the overlap capacitance $C_{OV}$ on the drain side is defined to be equal to the overlapping capacitance $C_{OV1}$ between the gate and the drain plus the fringing capacitance $C_{OV2}$ between the edge of the gate and the drain.

In FIG. 2, there is shown a top plan view of the MOS transistor 102 of FIG. 1 so as to better illustrate the areas where the overlap capacitances are formed. In particular, the source region 104 has a width W and a length $Y_s$. The drain region 106 has also a width W and a length $Y_d$. The gate electrode 112 has also a width W and a length L'. Further, the (effective) channel length is L, the source overlap length is $L_s$, and the drain overlap is $L_d$. Thus, the overlapping capacitance $C_{OV1}$ on the source side is measured between area 114 and area 116, and the fringing capacitance $C_{OV2}$ is measured between the edge of the area 114 adjacent the channel and the area 116. Similarly, the overlapping capacitance $C_{OV1}$ on the drain side is measured between area 118 and area 120, and the fringing capacitance $C_{OV2}$ is measured between the edge of the area 118 adjacent the channel and the area 120.

It should be understood that by decreasing the channel length L the overlap capacitance $C_{OV}$ on both the source and drain sides will be increased, if the gate, source and drain dimensions are maintained, which will adversely effect the operation of the transistor by increasing the RC delay time. Also, as the devices being scaled-down, the overlap capacitance will become more and more critical and influential on the speed performance. This is due to the fact that the percentage of the overlap capacitance including the fringing capacitance to the total gate capacitance will become larger and thus plays a more dominant role in the speed performance. Therefore, there still exists a need of developing an improved device structure which will have CMOS transistors having both channel length reduction and overlap capacitance reduction.

Since NAND logic gate circuits are considered to be the basic building block used in microprocessor design, the inventors of the present invention conducted a study of the speed performance on ring oscillators in the 3-input NAND inverter circuit of the type as shown in FIG. 3 and labeled "Prior Art" which are connected to each other in multiple stages. As a result of the investigation about the relationship between the P-channel and N-channel transistors having shorter channel lengths and the overlap capacitance reduction, the inventor has discovered a way of fabricating a faster NAND logic gate circuit for use in microprocessor designs which has higher speeds of operation.

Moreover, according to the fabrication process of the invention, the NAND logic gate circuit can be manufactured by utilizing the same "nominal sub-micron" CMOS fabrication technology so that existing equipment is used and no investment in new equipment is necessitated, thereby avoiding any increase in manufacturing costs. As used herein, the term "nominal sub-micron" refers to a quarter-micron process where the channel length is 0.25 μm. The term "sub-nominal" means smaller than the nominal sub-micron.

SUMMARY OF THE INVENTION

Accordingly, it is a general object of the present invention to provide an improved NAND logic gate circuit for use in microprocessors which has higher speeds of operation.

It is an object of the present invention to provide a faster NAND for microprocessors using unevenly sub-micron P-channel and N-channel CMOS transistors with reduced overlap capacitance.

It is another object of the present invention to provide a NAND logic gate circuit which includes P-channel and N-channel transistors having channel lengths which are shorter than the nominal sub-micron channel lengths.

It is still another object of the present invention to provide an improved NAND logic gate circuit which can be manufactured by utilizing the same "nominal sub-micron" CMOS fabrication technology, thereby avoiding any increases in manufacturing costs.

It is yet still another object of the present invention to provide a method for fabricating a NAND logic gate circuit for use in microprocessors which has a higher operating speed.

In a preferred embodiment of the present invention, there is provided an improved NAND logic gate circuit for use in microprocessors which has a higher operating speed. The NAND logic gate circuit includes a parallel structure and a stacked structure. The parallel structure is formed of a plurality of P-channel MOS transistors all connected together in parallel. The stacked structure is formed of a plurality of N-channel MOS transistors all connected together in series. Each of the plurality of P-channel MOS transistors has a first sub-nominal channel length with reduced overlap capacitance. Each of the plurality of N-channel MOS transistors has a second sub-nominal channel length with reduced overlap capacitance.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 is a schematic circuit diagram of a prior art NAND logic gate circuit, illustrating P-channel and N-channel MOS transistors with nominal sub-micron channel lengths; and FIG. 4 is a schematic circuit diagram of a NAND logic gate circuit, constructed in accordance with the principles of the present invention and illustrating P-channel and N-channel MOS transistors with channel lengths shorter than the nominal channel lengths.

DESCRIPTION OF THE PREFERRED EMBODIMENT

Figure 1:
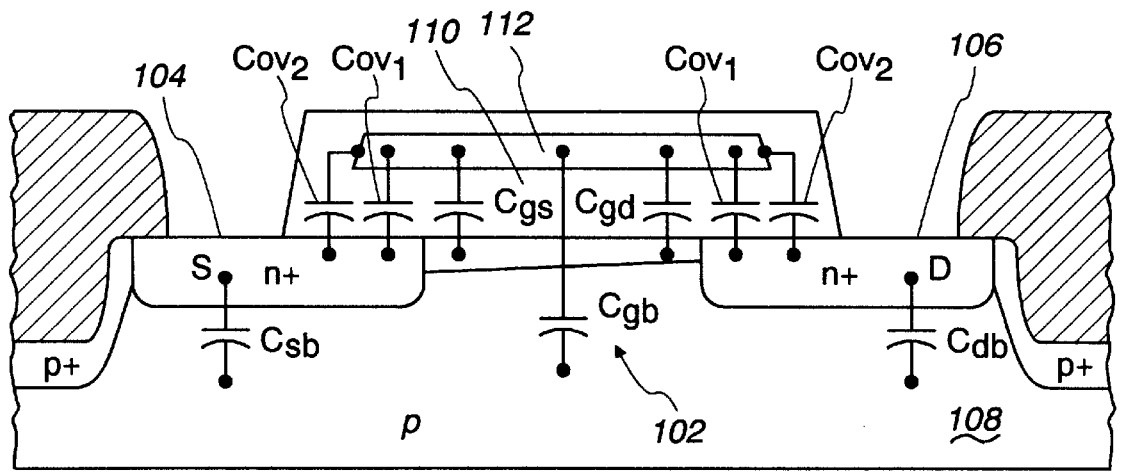
FIG. 1 is a cross-sectional view of a MOS transistor, illustrating the overlap capacitance $C_{OV}$ formed of the overlapping capacitance $C_{OV1}$ and the fringing capacitance $C_{OV2}$ on both the source and drain sides.
Figure 2:
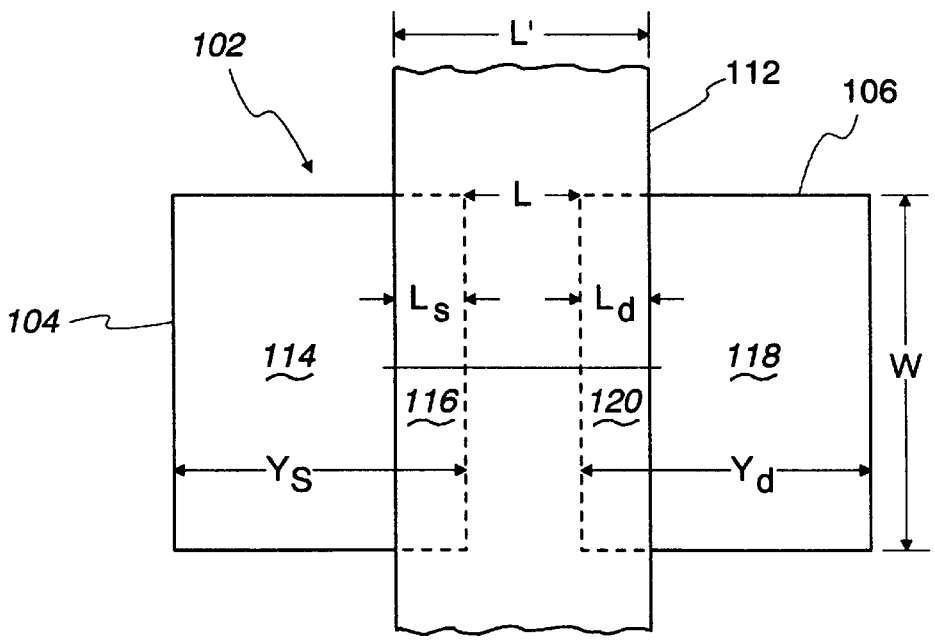
FIG. 2 is a top plan view of the MOS transistor of FIG. 1, illustrating the areas where the overlap capacitances are formed.

Referring now in detail to the drawings, there is illustrated in FIG. 3 a schematic circuit diagram of a prior art NAND logic gate circuit 10. The NAND logic gate circuit 10 is comprised of a parallel P-channel structure and a stacked N-channel structure. The parallel P-channel structure is formed of a plurality of P-channel MOS transistors P1, P2 and P3. Each of the P-channel transistors P1–P3 has a source, a drain, and a gate. The sources of the transistors P1–P3 are all connected together and to an upper power supply voltage or potential VCC. The drains of the transistors P1–P3 are all connected together and to an output terminal 12 for generating an output signal $V_{OUT}$.

The stacked N-channel structure is formed of a plurality of N-channel MOS transistors N1, N2, and N3. Each of the N-channel transistors N1–N3 has a drain, a source, and a gate. The transistor N1 has its drain connected also to the output terminal 12, its source connected to the drain of the transistor N2, and its gate connected to the gate of the transistor P1 at a first input terminal 14. The transistor N2 has its source connected to the drain of the transistor N3 and its gate connected to the gate of the transistor P2 at a second output terminal 16. The transistor N3 has its source connected to a lower power supply voltage or potential VSS and its gate connected to the gate of the transistor P3 at a third input terminal 18.

As used herein, the term "channel length" is the distance between the source and drain regions in the P-channel and N-channel MOS transistors. Also, when the source and drain regions are determined in a self-alignment with respect to a gate electrode, the channel length is defined to be the width of the gate electrode. The P-channel and N-channel transistors of the NAND circuit 10 are made by a sub-micron CMOS technology process where they have a uniform channel length (e.g., channel length L=0.5 μm). In other words, the channel lengths $L_{P1}$, $L_{P2}$, and $L_{P3}$ of the respective P-channel transistors P1–P3 are made equal to a nominal sub-micron channel length $L_{nom-P}$ or 0.25 μm. Similarly, the channel length $L_{N1}$, $L_{N2}$ and $L_{N3}$ of respective N-channel transistors N1–N3 are made equal to the nominal sub-micron channel length $L_{nom-n}$ or 0.25 μm. The overlap capacitances are represented by the symbol $C_{OV}$ which are connected between the gate and the source and between the gate and the drain for the corresponding P-channel and N-channel transistors. Thus, the NAND circuit 10 of FIG. 3 is used as a reference for comparisons. It was found that the NAND circuit 10 had an output frequency $f_0$ of 86 MHZ.

In order to determine the speed performance due to the reduction of channel length alone, a study was conducted by the inventor through a set of Hspice simulations on the NAND circuit 10 of FIG. 3. As can be seen from Table I listed below, there is shown the speed performance comparison by channel length reduction only of the N-channel transistors. In Case I, the top transistor N1 has the longest channel length at $L_{N1}$=0.25 μm; the middle transistor N2 has a channel length at $L_{N2}$=0.225 μm; and the bottom transistor N3 has the shortest channel length at $L_{N3}$=0.20 μm. This produced an output frequency $f_2$=9.15 MHZ and a relative speed ratio of 1.06 ($f_2/f_0$). In Case II, the only difference from Case I is that the channel length $L_{N2}$ of the transistor N2 was also reduced to 0.20 μm. As a result, the output frequency $f_3$ was 9.35 MHZ and the relative speed ratio was 1.08 ($f_3/f_0$). Accordingly, this indicates that changing the channel length of only the N-channel transistors will only produce a 6–8% gain in frequency and thus did not increase significantly the circuit speed.

TABLE I

| FAST NAND | No $C_{ov}$ Reduction | RATIO 1 |
|---|---|---|
| Case I $f_2$ (MHZ) | p:L = 0.25, n:L1 = 0.25, L2 = 0.225, L3 = 0.2 91541560 | 1.062248 |
| Case II $f_3$ (MHZ) | p:L = 0.25, n:L1 = 0.25, L2 = 0.2, L3 = 0.2 93597903 | 1.08611 |

In comparison, as can be seen from the upper portion of Table II below, the output frequency $f_0$ was 86 MHZ as previously mentioned where all of the P-channel and N-channel transistors had the same uniform channel length of 0.25 μm. The channel lengths of the P-channel transistors P1–P3 are designated by L, and the channel lengths of the N-channel transistors N1–N3 are designated by L1, L2 and L3, respectively.

TABLE II

| FAST NAND | No C$_{ov}$ Reduction | RATIO 2 |
|---|---|---|
| f$_0$ (MHZ) | p:L = 0.25, n:L1 = L2 = L3 = 0.25<br>8.6E + 07 | 1 |
| f$_1$(MHZ) | p:L = 0.225, n:L1 = L2 = L3 = 0.20<br>1.6E + 08 | 1.81539 |

On the lower portion of Table II, the channel lengths of both the P-channel and N-channel transistors were reduced over the nominal sub-micron channel length, but on an uneven basis. The nominal sub-micron channel length of the P-channel transistors is designated by L$_{nom-p}$. The nominal sub-micron channel length of the N-channel transistors is designated by L$_{nom-n}$. In other words, the channel length reduction of the N-channel transistors were made more aggressively than for the P-channel transistor (e.g., L=0.225 μm<L$_{nom-p}$ and L1=L2=L3=0.20 μm<L$_{nom-n}$). This resulted in an output frequency f$_1$ of 160 MHZ and a relative speed ratio of 1.82 (f$_1$/f$_0$) . Thus, it indicates that a speed gain of more than 80% can be achieved by reducing unevenly the channel length of both the P-channel and N-channel transistors.

In addition, the inventor has made an investigation through a set of Hspice simulations on the NAND circuit 10 of FIG. 3 to determine the speed performance due to the reduction of overlap capacitance alone relative to the total gate capacitance. As can be seen from Table III listed below, there is shown the speed performance for a 15% reduction in the overlap capacitance alone (i.e., 7.5% on each side of drain and source) where all of the P-channel and N-channel transistors had the same uniform channel length of 0.25 μm. This produced an output frequency f$_4$≈90 MHZ and a relative speed ratio of 1.041 (f$_4$/f$_0$). Therefore, this indicates that reduction of the overlap capacitance alone will merely produce a 4% gain in frequency and again did not increase dramatically the circuit speed.

TABLE III

| FAST NAND | 15% C$_{ov}$ REDUCTION | RATIO 3 |
|---|---|---|
| f$_4$ (MHZ) | p:L = 0.25, n:L = 0.25<br>9E + 07 | 1.041 |

Finally, the inventor conducted a study on the NAND circuit 10 of FIG. 3 to determine the speed performance due to both the uneven channel length reductions of Table II above and the overlap capacitance reduction of Table III above. As will be noted from Table IV listed below, there is produced an f$_5$≈170 MHZ and a relative speed ratio of 1.92 (f$_5$/f$_0$). As a consequence, this indicates that by both channel length reduction and overlap capacitance reduction, the speed performance can be further enhanced another 11% over the uneven channel length reduction alone in the lower portion of Table II.

TABLE IV

| FAST NAND | CHANNEL LENGTH REDUCTION<br>15% C$_{ov}$ REDUCTION | RATIO 4 |
|---|---|---|
| f$_5$ (MHZ) | p:L = 0.225, n:L = 0.20<br>1.7E + 08 | 1.92 |

In FIG. 4, there is shown a schematic circuit diagram of an improved NAND logic gate circuit 110, constructed in accordance with the principles of the present invention, for use in microprocessors which is capable of operating at higher speeds. It will be noted that the sub-nominal channel lengths of the P-channel and N-channel transistors correspond to the lower portion of Table II. The NAND circuit 110 is comprised of a parallel P-channel structure and a stacked N-channel structure. The parallel P-channel structure is formed of a plurality of P-channel MOS transistors P101, P102, and P103 which are all connected together in parallel. Each of the P-channel transistor ors P101–P103 has a source, a drain, and a gate. The sources of the transistors P101–P103 are all connected together and to an upper power supply voltage or potential VCC. The drains of the transistors P101–P103 are connected together and to an output terminal 12a for generating an output signal V$_{OUT}$.

The stacked N-channel structure is formed of a plurality of N-channel MOS transistors N101, N102, and N103 which are all connected together in series. Each of the N-channel transistors N101–N103 has a drain, a source, and a gate. The transistor N101 has its drain connected also to the output terminal 12a, its source connected to the drain of the transistor N102, and its gate connected to the gate of the transistor P101 at a first input terminal 14a. The transistor N102 has its source connected to the drain of the transistor N103 and its gate connected to the gate of the transistor P102 at a second input terminal 16a. The transistor N103 has its source connected to a lower power supply voltage or potential VSS and its gate connected to the gate of the transistor P103 at a third input terminal 18a.

The P-channel and N-channel transistors of the NAND circuit 110 are made by the same sub-micron CMOS technology process used for fabricating the NAND circuit 10 of FIG. 3. As a result, the same existing equipment can be used so as to eliminate increases in manufacturing costs. Both the P-channel transistors P101–P103 and the N-channel transistors N101–N103 are made with sub-nominal channel lengths L$_{sub-p}$, L$_{sub-n}$ (the sub-nominal channel lengths are shorter than the nominal sub-micron channel lengths L$_{nom-p}$=0.255 μm and L$_{nom-n}$=0.25 μm). However, the channel length of the N-channel transistors are made shorter than the channel length of the P-channel transistors. In particular, the channel lengths L$_{P101}$, L$_{p102}$, and L$_{p103}$ of the respective P-channel transistors P101–P103 were made to be 0.225 μm, and the channel lengths L$_{N101}$, L$_{N102}$, and L$_{N103}$ of the respective N-channel transistors N101–N103 are made to be 0.20 μm.

The reduction of the channel lengths of the P-channel and N-channel transistors have the advantages of (1) reducing the threshold voltage V$_{th}$, (2) producing a higher saturation current I$_{dsat}$, and (3) providing a higher linear region drive current I$_{dlin}$. Further, since the N-channel transistors in the NAND circuit 110 are connected in series in the stacked structure as opposed to the parallel P-channel transistors they will have a relatively smaller amount of leakage current for a given channel length. Thus, the channel lengths of the N-channel transistors N101–N103 can be made with a smaller channel length than the P-channel transistors P101–P103. The reduction of the channel length of the P-channel transistor has the added advantage of decreasing the gate capacitance loading C$_{gate-p}$.

Although the reduction of the channel length will provide a speed enhancement due to higher drive current, it is recognized that there is a limit of the current driving capability in terms of scaling down the sizes of the transistor devices for a given quarter micron CMOS process. Accordingly, the overlap capacitance C$_{OV}$ between the gate and the source/drain of the corresponding P-channel and N-channel transistors must also be reduced in order to obtain speed optimization. Thus, the overlap capacitance in the NAND circuit 110 of FIG. 4 can be made equal to or smaller than the overlap capacitance $C_{OV}$ of FIG. 3 ($\leq C_{OV}$).

Therefore, as can be seen from the above Table IV the circuit speed can be nearly doubled by a 15% reduction in the overlap capacitance (7.5% on each side of the drain region and the source region). The output frequency $f_5=170$ MHZ was obtained and a relative speed ratio of 1.92 was produced ($f_5/f_0$). Consequently, the speed performance can be optimized through both channel length reduction and overlap capacitance reduction. It should be apparent to those skilled in the art that there are many ways in which to reduce the overlap capacitance during the fabrication process of the drain and source regions, such as by reducing the dimensions $L_s$, $L_d$.

From the foregoing detailed description, it can thus be seen that the present invention provides an improved NAND logic gate circuit for use in microprocessors which has a higher operating speed. The NAND circuit of the present invention includes a parallel structure formed of a plurality of P-channel MOS transistors all connected together in parallel and a stacked structure formed of a plurality of N-channel MOS transistors all connected together in series. Both the P-channel transistors and N-channel transistors are formed with sub-nominal channel lengths and with overlap capacitance reduction.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. An improved NAND logic gate circuit for use in microprocessors which has a higher operating speed comprising:

a parallel structure formed of a plurality of P-channel MOS transistors all connected together in parallel;

a stacked structure formed of a plurality of N-channel MOS transistors all connected together in series;

said plurality of P-channel MOS transistors each having a first sub-nominal channel length;

said plurality of N-channel MOS transistors each having a second sub-nominal channel length;

said second sub-nominal channel length being shorter than said first sub-nominal channel length;

said first sub-nominal channel length being 0.225 μm.; and said second sub-nominal channel length being 0.20 μm.

2. An improved NAND logic gate circuit as claimed in claim 1, wherein said P-channel and N-channel transistors are formed with reduced overlap capacitance.

3. An improved NAND logic gate circuit as claimed in claim 1, wherein the operating speed is increased by approximately 80%.

4. An improved NAND logic gate circuit as claimed in claim 2, wherein the overlap capacitance is reduced by 15% so as to produce an enhancement in the operating speed.

5. An improved NAND logic gate circuit as claimed in claim 2, wherein each of said plurality of P-channel MOS transistors has a source, a drain, and a gate, the sources of said plurality of P-channel MOS transistors being all connected together and to an upper power supply voltage, the drains thereof being connected together and to an output terminal.

6. An improved NAND logic gate circuit as claimed in claim 5, wherein each of said plurality of N-channel MOS transistors has a source, a drain, and a gate, the drains and sources of said plurality of N-channel MOS transistors being connected together in series between said output terminal and a lower power supply voltage, each of the gates of said plurality of N-channel transistors being connected to a corresponding one of the gates of said plurality of P-channel transistors.

7. A method for fabricating a NAND logic gate circuit for use in microprocessors which has a higher operating speed, said method comprising the steps of:

connecting a plurality of P-channel MOS transistors in parallel;

connecting a plurality of -channel MOS transistors in series;

forming each of said plurality of P-channel MOS transistors with a first sub-nominal channel length;

forming each of said plurality of N-channel MOS transistors with a second sub-nominal channel length;

said second sub-nominal channel length being shorter than said first sub-nominal channel length;

said first sub-nominal channel length being 0.225 μm.; and said second sub-nominal channel length being 0.20 μm.

8. A method for fabricating a NAND logic gate circuit as claimed in claim 7, wherein said P-channel and N-channel transistors are formed with reduced overlap capacitance.

9. A method for fabricating a NAND logic gate circuit as claimed in claim 7, wherein the operating speed is increased by approximately 80%.

10. A method for fabricating a NAND logic gate circuit as claimed in claim 8, wherein the overlap capacitance is reduced by 15% so as to produce an enhancement in the operating speed.

11. A method for fabricating a NAND logic gate circuit as claimed in claim 8, wherein each of said plurality of P-channel MOS transistors has a source, a drain, and a gate, the sources of said plurality of P-channel MOS transistors being all connected together and to an upper power supply voltage, the drains thereof being connected together and to an output terminal.

12. A method for fabricating a NAND logic gate circuit as claimed in claim 11, wherein each of said plurality of N-channel MOS transistors has a source, a drain, and a gate, the drains and sources of said plurality of N-channel MOS transistors being connected together in series between said output terminal and a lower power supply voltage, each of the gates of said plurality of N-channel transistors being connected to a corresponding one of the gates of said plurality of P-channel transistors.

* * * * *

UNITED STATES PATENT AND TRADEMARK OFFICE
CERTIFICATE OF CORRECTION

PATENT NO : 5,982,199
DATED : November 9, 1999
INVENTOR(S): Larry S. Yu

It is certified that error appears in the above-identified patent and that said Letters Patent is hereby corrected as shown below:

Column 6, line 38, change "0.255" to -- 0.25 --.

Signed and Sealed this

Twenty-third Day of May, 2000

Attest:

Q. TODD DICKINSON

*Attesting Officer*  *Director of Patents and Trademarks*